United States Patent
Toh et al.

(10) Patent No.: US 7,319,497 B2
(45) Date of Patent: Jan. 15, 2008

(54) PRINTED CIRCUIT BOARD CONFIGURABLE TELEVISION TUNER

(75) Inventors: Yeow Teng Toh, Singapore (SG); Eng Nguen Pang, Singapore (SG)

(73) Assignee: NXP B.V., Eindhoven (NL)

( * ) Notice: Subject to any disclaimer, the term of this patent is extended or adjusted under 35 U.S.C. 154(b) by 471 days.

(21) Appl. No.: 10/502,830

(22) PCT Filed: Jan. 17, 2003

(86) PCT No.: PCT/IB03/00109

§ 371 (c)(1),
(2), (4) Date: Jul. 28, 2004

(87) PCT Pub. No.: WO03/065580

PCT Pub. Date: Aug. 7, 2003

(65) Prior Publication Data

US 2005/0101274 A1    May 12, 2005

(30) Foreign Application Priority Data

Feb. 1, 2002    (WO) .................... PCT/SG02/00038

(51) Int. Cl.
*H04N 5/50* (2006.01)
*H04N 5/46* (2006.01)

(52) U.S. Cl. ..................................... 348/731; 348/555
(58) Field of Classification Search ............... 348/731, 348/725, 554, 555; 455/302, 180.1, 266; 333/175, 176; 334/55, 78
See application file for complete search history.

(56) References Cited

U.S. PATENT DOCUMENTS

| | | | | |
|---|---|---|---|---|
| 5,696,471 A * | 12/1997 | Fujiwara | ...................... | 333/177 |
| 5,822,542 A * | 10/1998 | Smith et al. | ................. | 709/247 |
| 7,071,798 B2 * | 7/2006 | Gomez et al. | .............. | 333/219 |
| 7,084,720 B2 * | 8/2006 | Gomez et al. | .............. | 333/204 |

* cited by examiner

*Primary Examiner*—Victor R. Kostak

(57) ABSTRACT

A television tuner comprises a tunable bandpass filter (4) for selecting a desired input channel with an image canceling capacitor (C8) for rejecting the image frequency of the desired input channel. In order to avoid the necessity of different printed circuit boards for NTSC-type television tuners and for PAL-type television tuners, the image canceling capacitor (C8) is made of first (8) and second (10) traces of the printed circuit board while a third trace (13) is connected to the second trace (10) by a jumper (15) only in case of a PAL-type tuner.

7 Claims, 2 Drawing Sheets

PRINTED CIRCUIT BOARD CONFIGURABLE TELEVISION TUNER

Figure 1:
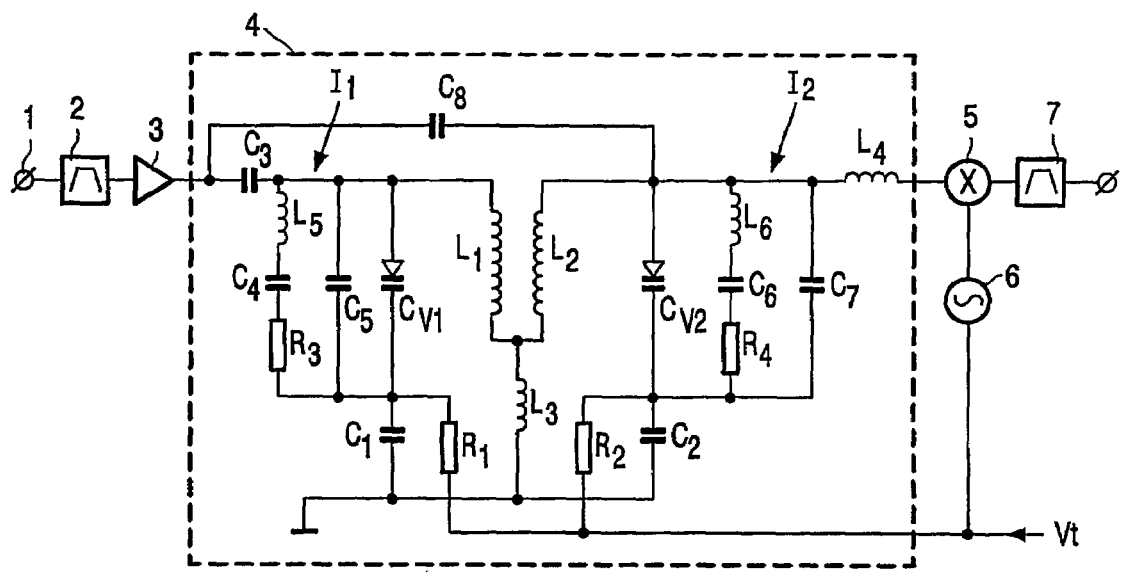

This invention relates to a television tuner for receiving a plurality of television channels, comprising a bandpass filter tunable to the desired channel frequency, and a mixer for transferring, with a tunable local oscillator, the desired channel frequency to a predetermined intermediate frequency, said tunable bandpass filter comprising reactive elements mounted on a printed circuit board for enhancing the transmission of the desired channel frequency and an image suppression capacitance for reducing the transmission of the image frequency.

Such television tuners are well known in the art. The received television channels are applied to a mixer where they are mixed with a tunable local oscillator frequency. The output of the mixer is filtered in a fixed tuned intermediate frequency filter. In this IF-filter the desired channel is passed and the neighboring channels are rejected. Moreover in this IF filter the Nyquist filtering of the video signals of the desired channel is done as well as the leveling of the audio signal. By changing the local oscillator frequency, another channel is transferred to the intermediate frequency and passed through the fixed tuned intermediate frequency filter.

A selectivity problem, which cannot be solved by the IF-filter, is the suppression of the image frequency signal. The image frequency signal is the undesired input signal that lies, at the distance of the intermediate frequency, on the other side of the oscillator frequency from the desired television signal. Without appropriate measures, the undesired image frequency and the desired television signal are both transferred to the intermediate frequency, so that the undesired image frequency would distort the desired channel. In order to avoid this problem the usual television tuners comprise, in the input signal lead to the mixer, a tunable bandpass filter that is tuned to the desired input channel and that suppresses, to a certain degree, the transmission of the undesired image signal to the mixer.

Usually, the tuned bandpass filter comprises two inductively coupled resonant circuits, each tuned to the desired channel frequency. The undesired image frequency then lies on the flank of the transmission curve of the bandpass filter, so that an attenuation of the undesired image frequency with respect to the desired channel frequency is obtained. A substantial further reduction of the transmission of the image frequency can be obtained with a small image canceling capacitor that is connected between the two tuned circuits of the bandpass filter and that constitutes, together with the inductive coupling between the two tuned circuits, in the transmission function of the bandpass filter a zero at the image frequency.

In present day television there are essentially two systems that make up the total market, namely NTSC and PAL. The intermediate frequency is 45.75 MHz for NTSC and 38.89 MHz for PAL, which implies that the image frequency for NTSC lies 2×45.75=91.50 MHz above the desired channel frequency and that the image frequency for PAL lies 2×38.89=77.78 MHz above the desired channel frequency. Therefore, the image canceling capacitor should have a different value for NTSC tuners than for PAL tuners.

This difference in image frequency makes it more difficult to economically manufacture high quality television tuners. Because the image canceling capacitance is too small to produce as a lumped capacitor and therefore should be produced by distributed capacitance on the printed circuit board, the production of this capacitance on a common printed circuit board for NTSC and PAL results in a compromised image rejection performance for both systems.

The alternative of using two separate printed circuit boards, one for the NTSC-tuners and one for the PAL-tuners avoids this compromise but increases the manufacturing costs.

The present invention seeks to avoid this compromise while still using a common printed circuit board for both systems, and the television tuner according to the invention is therefore characterized in that said printed circuit board comprises first, second and third traces, in that in case of a television tuner for NTSC-type signals, the image suppression capacitance comprises said first and second traces while said third trace is idle and in that, in case of a television tuner for PAL-type signals, said second and third traces are interconnected and the image suppression capacitance comprises said first trace and said interconnected second and third traces. Therefore, a single printed circuit board can de used both for the NTSC and for the PAL-tuners, while, in case of PAL-tuners, a simple interconnection has to be made between said second and third printed circuit board traces. Preferably the television tuner of the present invention is further characterized in that, in case of a television tuner for PAL-type signals, the interconnection between the second and third traces is constituted by a lumped zero-ohm resistor. In that case the interconnection between the second and third traces can be applied during the same manufacturing process with which the other lumped components are applied to the printed circuit board.

If the television tuner is a multiband tuner comprising a tunable bandpass filter for UHF-channel frequencies (typically 470-860 MHz) and a tunable bandpass filter for mid-band channel frequencies (typically 160-450 MHz) on a single printed circuit board, the television tuner according to the present invention may further be characterized by said printed circuit board comprising first, second and third UHF-traces for constituting the image suppression capacitance of the bandpass filter for UHF-channel frequencies and first, second and third mid-band traces for constituting the image suppression capacitance of the bandpass filter for Mid band channel frequencies. If the television tuner according to the present invention is also capable of tuning to the VHF channel frequencies, further traces may be applied for these bands, however, the frequencies for these frequency bands are usually low enough so that the image canceling capacitances can be made by lumped capacitances.

It may be observed that in case of a tunable bandpass filter for UHF-frequencies, these frequencies are usually so high and consequently the correction of the image canceling capacitance for PAL is usually so low, that the third PCB trace may merely consist of a simple connection pad. In that case the additional capacitance is made up by said path and the interconnection only.

The invention also relates to a printed circuit board for use in a television tuner which is characterized in that said printed circuit board comprises first, second and third traces for constituting an image canceling capacitor both in NTSC-type television tuners and in PAL-type television tuners.

Figure 2:
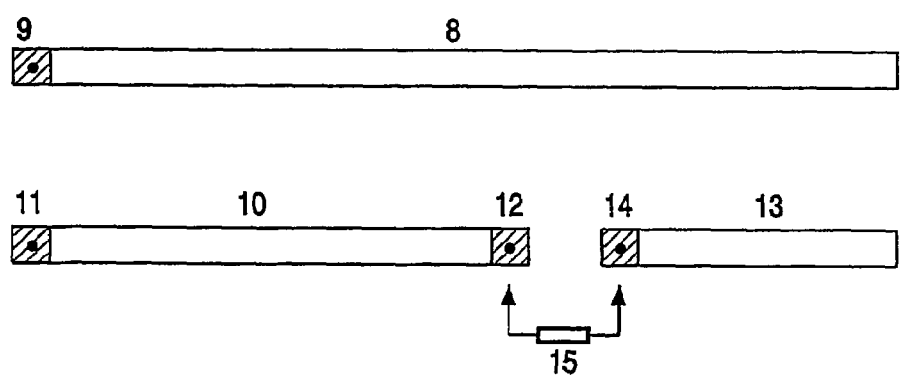
Figure 3:
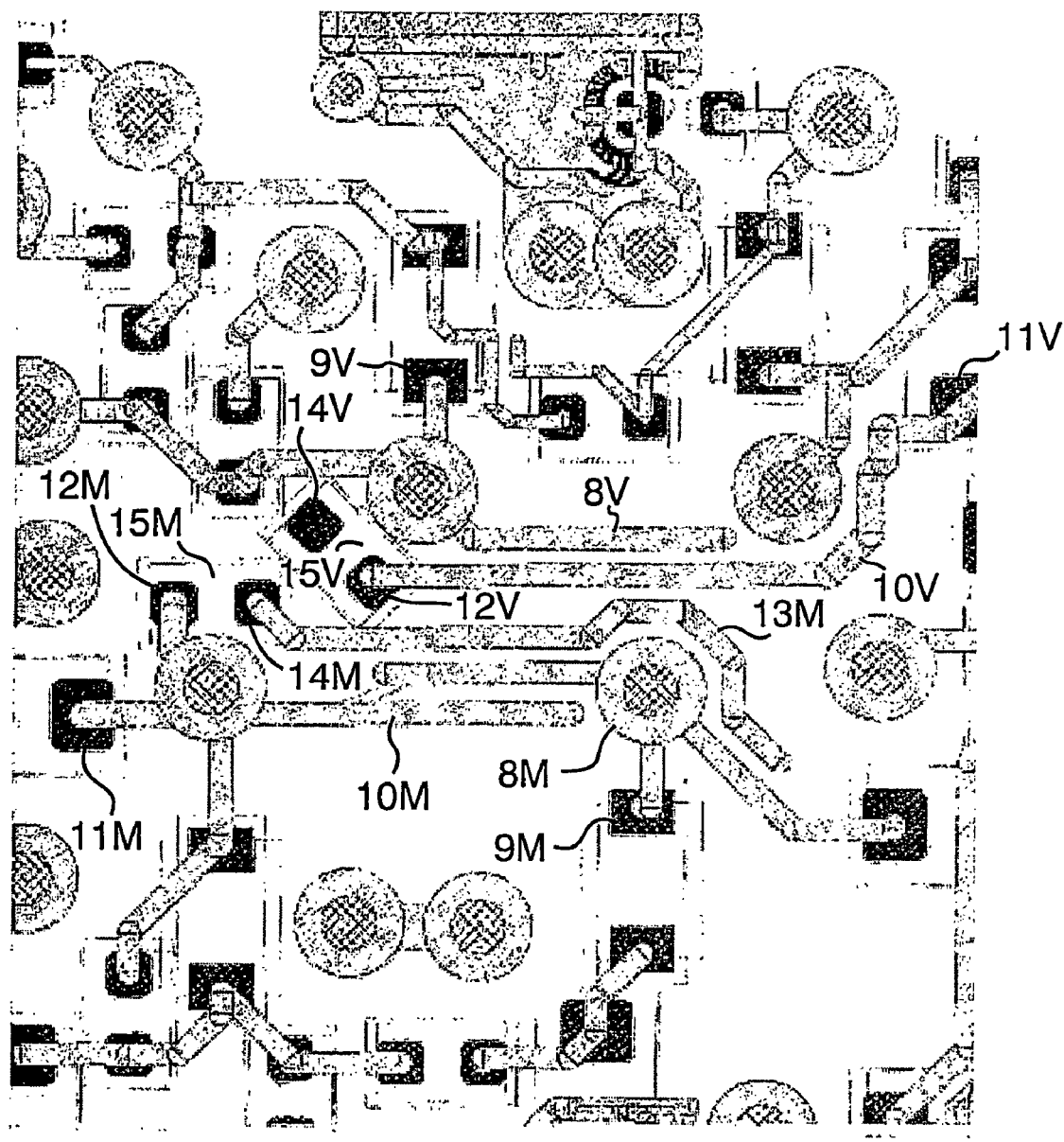

The invention will be further explained with reference to the attached Figures. Herein shows:

FIG. 1 an exemplary circuit diagram of a prior art television tuner,

FIG. 2, in schematic form, the printed circuit board traces that together make the image canceling capacitance in a television tuner according to the invention, and FIG. 3 a part of a printed circuit board for use in a multiband television receiver according to the invention.

The television tuner of FIG. 1 comprises an RF signal input 1 to which an antenna or cable may be connected for applying a plurality of RF modulated TV-channels to the television tuner. The RF signals are passed through a fixed tuned preselection filter 2 for rejecting signals outside the desired frequency band and subsequently amplified in an RF amplifying stage 3. The RF output signals of this amplifying stage are applied to a tuned bandpass filter 4 wherein all but the desired TV channel are attenuated with respect to the desired channel and wherein especially the image frequency of the desired TV channel is attenuated.

In a mixer stage 5 the output of the bandpass filter 4 is multiplied by a local oscillator signal from a tuned local oscillator 6. In doing so the RF output signal of the bandpass filter 4 is transferred to an intermediate frequency signal that is subsequently passed to a fixed tuned intermediate frequency filter 7.

The main components of the tuned bandpass filter 4 are a first resonant circuit, comprising an inductor $L_1$ and a variable capacitor $C_{v1}$, and a second resonant circuit, comprising an inductor L2 and a variable capacitor $C_{v2}$. The variable capacitors are each connected to ground through fixed capacitors $C_1$ and $C_2$ respectively, and the two inductors $L_1$ and $L_2$ are connected to ground through a common inductor $L_3$ that constitutes an inductive base coupling between the two resonant circuits. A tuning voltage $V_t$ for varying the capacitance of the capacitors $C_{v1}$ and $C_{v2}$ is applied through a resistor $R_1$ to the junction of variable capacitor $C_{v1}$ and fixed capacitor $C_1$ and through a resistor $R_2$ to the junction of variable capacitor $C_{v2}$ and fixed capacitor $C_2$. The tuning voltage is also applied to the local oscillator 6. A coupling capacitor $C_3$ couples the output of the preamplifier stage 3 to the top of the first resonant circuit and a coupling inductor $L_4$ couples the top of the second resonant circuit to the input of the mixing stage 5.

The bandpass filter further comprises an impedance network $I_1$ (Philips patented diode coil design) consisting of a series circuit of an inductor $L_5$, a capacitor $C_4$ and a resistor $R_3$, and a capacitor $C_5$ constituting a parallel connection with said series circuit. This impedance network is connected across $C_{v1}$. A similar impedance network $I_2$, consisting of an inductor $L_6$, two capacitors $C_6$ and $C_7$ and a resistor $R_4$, is connected across $C_{v2}$. Finally the bandpass filter 4 comprises an image canceling capacitance $C_8$ connected between the input of the bandpass filter and the top of the second resonant circuit. Alternatively, the image canceling capacitor can be connected between the tops of the two resonant circuits. In operation the tuning of the bandpass filter 4 varies with the tuning of the local oscillator, so that always the bandpass filter passes the input signal channel whose frequency lies below that of the local oscillator at a distance equal to the intermediate frequency (IF). In the mixer 5 this desired input channel is transferred to the intermediate frequency and the IF-filter 7 subsequently selects this transferred signal.

In order to enhance the image suppression of the bandpass filter 4 this filter comprises the image canceling capacitor $C_8$. This capacitor is chosen so that it creates in the transmission function of the bandpass filter a "zero transmission frequency" at twice the intermediate frequency above the tuning frequency of the bandpass filter, this is: at the frequency where the image frequency is located.

In order for the image rejection to be as good as possible (e.g. better than −50 dB), the image cancellation capacitor should have a sufficiently accurate value. Moreover, the value of this capacitor is relatively small (e.g. less than 0.1 pF). Usually the television tuner is implemented with a printed circuit board on which the components, the active components as well as the passive components, are placed as lumped elements. However, a sufficiently small and accurate lumped capacitor for the image cancellation is very difficult to manufacture, so that the required image cancellation capacitor is usually obtained by distributed capacity between traces on the printed circuit board.

The invention is schematically shown in the trace-diagram of FIG. 2. This Figure shows a first trace 8 that constitutes the first "plate" of the image canceling capacitor $C_8$ and which comprises a first connection pad 9 for connecting this first "plate" to the rest of the bandpass filter 4. Further it shows a second trace 10 comprising second and third connection pads 11 and 12. When the television tuner is designed for NTSC-reception, where the usual intermediate frequency is 45.75 MHz and thus the image frequency is 91.5 MHz higher than the desired channel frequency, the second trace 10 constitutes the entire second "plate" of the image canceling capacitor $C_8$, which is connected to the rest of the bandpass filter through the second connection pad 11.

Additionally, the schematic diagram of FIG. 2 shows a third trace 13 comprising a connection pad 14. For NTSC reception this third trace is idle, however, when the television tuner is designed for PAL reception where the image frequency is only 2×38.89 MHz=77.98 MHz higher than the desired channel frequency, the connection pad 12 of the second trace and the connection pad 14 of the third trace are interconnected by a lumped short-circuit jumper 15 (zero ohm resistor). In this case the second and third traces together constitute the second "plate" of the image canceling capacitor, so that the capacitor value is preferably so much higher than in the case of an NTSC tuner, that it optimally suppresses the lower PAL image frequency. The advantage is that with one printed circuit board the two image canceling capacitors can be made with high accuracy and with low cost.

FIG. 3 shows the layout of part of a printed circuit board wherein the invention is used. This printed circuit board is to be used in a television tuner which is able to receive both mid-band channels and UHF band channels. In this Figure the same reference numerals 8-15 are used as in the trace diagram of FIG. 2 for the elements (traces, pads and jumpers) that make up the image canceling capacitors. Because the printed circuit board is for receiving of both the mid-band channels and the UHF band channels, the elements for the mid-band reception have an "M" added to their reference numerals and the elements for the UHF band reception have a "U" added to their reference numerals.

It may be observed that in this printed circuit board layout the third trace 13U for UHF-reception appears to be missing. However, the jumper 15U and the pad 14U together provide enough capacitance extension for PAL-tuners in the UHF-band, so that in fact the pad 14U constitutes the entire third trace.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A television tuner for receiving a plurality of television channels, comprising a bandpass filter (4) tunable to a desired channel frequency, and a mixer (5) for transferring, with a tunable local oscillator (6), the desired channel frequency to a predetermined intermediate frequency, said tunable bandpass filter (4) comprising reactive elements mounted on a printed circuit board for enhancing the transmission of the desired channel frequuency and an image suppression capacitance (C8) for reducing the transmission of the image frequency, characterized in that said printed circuit board comprises first (8), second (10) and third (13) traces, in that in case of a television tuner for NTSC signals, the image suppression capacitance (C8) comprises said first (8) and second (10) traces while said third trace (13) is idle and in that, in case of a television tuner for PAL signals, said second (10) and third (13) traces are interconnected and the image suppression capacitance (C8) comprises said first trace (8) and said interconnected second and third traces (10,13).

2. An NTSC television tuner for receiving a plurality of NTSC television channels, comprising a bandpass filter (4) tunable to a desired channel frequency, and a mixer (5) for transferring, with a tunable local oscillator (6), the desired channel frequency to a predetermined intermediate frequency, said tunable bandpass filter (4) comprising reactive elements mounted on a printed circuit board for enhancing the transmission of the desired channel frequency and an image suppression capacitance (C8) for reducing the transmission of the image frequency, characterized in that said printed circuit board comprises first (8), second (10) and third (13) traces and in that the image suppression capacitance comprises said first (8) and second (10) traces while said third trace (13) is idle.

3. A PAL television tuner for receiving a plurality of PAL television channels, comprises a bandpass filter (4) tunable to a desired channel frequency, and a mixer (5) for transferring, with a tunable local oscillator (6), the desired channel frequency to a predetermined intermediate frequency, said tunable bandpass filter (4) comprising reactive elements mounted on a printed circuit board for enhancing the transmission of the desired channel frequency and an image suppression capacitance (C8) for reducing the transmission of the image-frequency, characterized in that said printed circuit board comprises first (8), second (10) and third (13) traces and in that said second (10) and third (13) traces are interconnected and the image suppression capacitance (C8) comprises said first trace (8) and said interconnected second and third traces (10,13).

4. A television tuner as claimed in claim 1, characterized in that, in case of a television tuner for PAL signals, the interconnection between the second and third traces is constituted by a lumped zero-ohm resistor (15).

5. A television tuner as claimed in claim 1 comprising a tunable bandpass filter for UHF-channel frequencies and a tunable bandpass filter for mid band channel frequencies on a single printed circuit board, characterized by said printed circuit board comprises first, second and third UHF-traces (8U, 10U, 13U) for constituting an image suppression capacitance (C8) of the bandpass filter for UHF-channel frequencies, and first, second and third mid-band traces (8M, 10M, 13M) for constituting an image suppression capacitance (C8) of the bandpass filter for mid-band channel frequencies.

6. A television tuner as claimed in claim 5 comprising a tunable bandpass filter for UHF-channel frequencies, characterized in that the third UHF-trace (13U) consists of a single connection pad (14U) for the zero-ohm resistor.

7. A printed circuit board to be used in a television tuner as claimed in any of the preceding claims, characterized in that said printed circuit board comprises first (8), second (10) and third (13) traces for constituting an image canceling capacitor both in NTSC television tuners and in PAL television tuners.

* * * * *